United States Patent
Jeong et al.

(10) Patent No.: US 11,062,818 B2
(45) Date of Patent: Jul. 13, 2021

(54) STACKING STRUCTURE HAVING MATERIAL LAYER ON GRAPHENE LAYER AND METHOD OF FORMING MATERIAL LAYER ON GRAPHENE LAYER

(71) Applicant: Samsung Electronics Co., Ltd., Suwon-Si (KR)

(72) Inventors: Seong-jun Jeong, Ulsan (KR); Seong-jun Park, Seoul (KR); Hyeon-jin Shin, Suwon-si (KR); Yea-hyun Gu, Seoul (KR); Hyoung-sub Kim, Seoul (KR); Jae-hyun Yang, Suwon-si (KR)

(73) Assignees: Samsung Electronics Co., Ltd., Gyeonggi-do (KR); SUNGKYUNKWAN UNIVERSITY RESEARCH & BUSINESS FOUNDATION, Gyeonggi-do (KR)

( * ) Notice: Subject to any disclaimer, the term of this patent is extended or adjusted under 35 U.S.C. 154(b) by 846 days.

(21) Appl. No.: 14/588,734

(22) Filed: Jan. 2, 2015

(65) Prior Publication Data
US 2015/0194233 A1    Jul. 9, 2015

(30) Foreign Application Priority Data

Jan. 3, 2014  (KR) .................. 10-2014-0000931

(51) Int. Cl.
*B32B 9/00*    (2006.01)
*H01B 1/04*    (2006.01)
(Continued)

(52) U.S. Cl.
CPC ........... *H01B 1/04* (2013.01); *C23C 16/0281* (2013.01); *C23C 16/40* (2013.01); *C23C 16/405* (2013.01);
(Continued)

(58) Field of Classification Search
CPC ............ C01B 31/0438; C01B 31/0446; C01B 31/0453; Y10T 428/30; H01B 1/04; H01B 1/24; B82Y 40/00
(Continued)

(56) References Cited

U.S. PATENT DOCUMENTS 8,431,923 B2   4/2013  Goswami
8,518,491 B2   8/2013  Garces et al.
(Continued)

FOREIGN PATENT DOCUMENTS

KR   10-2011-0115105 A   10/2011
KR   10-2012-0098527 A    9/2012
(Continued)

OTHER PUBLICATIONS

Harry Alles et al., "Atomic layer deposition of $HfO_2$ on graphene from $HfCl_4$ and $H_2O$", 16 pages.
(Continued)

*Primary Examiner* — Daniel H Miller
(74) *Attorney, Agent, or Firm* — Harness, Dickey & Pierce, P.L.C.

(57) ABSTRACT

Example embodiments relate to a stacking structure having a material layer formed on a graphene layer, and a method of forming the material layer on the graphene layer. In the stacking structure, when the material layer is formed on the graphene layer by using an ALD method, an intermediate layer as a seed layer may be formed on the graphene layer by using a linear type precursor.

4 Claims, 5 Drawing Sheets

(51) Int. Cl.
*C23C 16/02* (2006.01)
*C23C 16/455* (2006.01)
*H01L 29/51* (2006.01)
*H01L 29/778* (2006.01)
*C23C 16/40* (2006.01)
*H01L 29/16* (2006.01)

(52) U.S. Cl.
CPC ...... *C23C 16/45553* (2013.01); *H01L 29/513* (2013.01); *H01L 29/7781* (2013.01); *H01L 29/1606* (2013.01); *Y10T 428/265* (2015.01); *Y10T 428/30* (2015.01)

(58) Field of Classification Search
USPC .......................................... 428/408; 423/448
See application file for complete search history.

(56) References Cited

U.S. PATENT DOCUMENTS

| | | | | |
|---|---|---|---|---|
| 2008/0073643 | A1* | 3/2008 | Ryu | H01L 33/02 257/43 |
| 2008/0169758 | A1* | 7/2008 | Cok | H01L 51/5262 313/506 |
| 2011/0095268 | A1* | 4/2011 | Choi | H01L 29/78684 257/29 |
| 2012/0091413 | A1* | 4/2012 | Nguyen | H01L 27/101 257/2 |
| 2013/0104323 | A1* | 5/2013 | Beecher | B08B 17/06 15/94 |
| 2013/0187127 | A1* | 7/2013 | Yi | H01L 33/007 257/13 |
| 2014/0198371 | A1* | 7/2014 | Conklin | G02F 1/163 359/275 |

FOREIGN PATENT DOCUMENTS

KR   10-1195040 B1   10/2012
KR   10-1224866 B1   1/2013

OTHER PUBLICATIONS

Woo Cheol Shin et al., "Seeding atomic layer deposition of high-k dielectric on graphene with ultrathin poly(4-vinylphenol) layer for enhanced device performance and reliability" AIP Applied Physics Letters 101, 033507 (2012), 5 pages.

Justice M.P. Alaboson et al., "Seeding Atomic Layer Deposition of High-κ Dielectrics on Epitaxial Graphene with Organic Self-Assembled Monolayere", vol. 5, No. 6 5223-5232, 2011, 10 pages, ACSNANO.

Office Action dated Apr. 2, 2020 in Korean Application No. 10-2014-0000931.

* cited by examiner ered to in the description that follows. The drawings in which:
STACKING STRUCTURE HAVING MATERIAL LAYER ON GRAPHENE LAYER AND METHOD OF FORMING MATERIAL LAYER ON GRAPHENE LAYER

RELATED APPLICATIONS

This application claims priority from Korean Patent Application No. 10-2014-0000931, filed on Jan. 3, 2014, in the Korean Intellectual Property Office, the disclosure of which is incorporated herein in its entirety by reference.

BACKGROUND

1. Field

Example embodiments relate to stacking structures having a material layer on a graphene layer, and/or methods of forming the material layer on the graphene layer.

2. Description of the Related Art

Graphene has typically stable and high electrical, mechanical, and chemical characteristics as well as high electrical conductivity, and thus, many studies about nanodevices that use graphene have been actively conducted. Due to its high electrical and mechanical characteristics, graphene has drawn attention as a next generation material in many fields since the graphene has been discovered.

Graphene is a material in which carbon atoms are connected in a hexagonal shape in a plane and has a thickness as small as a single atomic layer. Graphene has an electric conductivity that is 100 times greater than the electric conductivity of mono-crystal silicon, which is normally used as a semiconductor, and it is known that graphene has a carrier mobility that is higher than about 100,000 cm2/Vs. Also, it is known that graphene is capable of handling amounts of electricity that are 100 times greater than the amount of electricity being handled by copper, and thus, graphene has drawn attention as a basic material for electronic circuits.

Graphene is a zero gap semiconductor material, and when a graphene nano-ribbon (GNR) having a graphene channel width of about 10 nm or less is formed, a band gap is formed due to a nano-size effect. Accordingly, electronic devices that may be operated at room temperature may be manufactured using the GNR.

SUMMARY

Example embodiments relate to stacking structures having a material layer formed on a graphene layer, and/or methods of forming the material layer formed on the graphene layer.

Additional aspects will be set forth in part in the description which follows and, in part, will be apparent from the description, or may be learned by practice of the example embodiments.

According to at least one example embodiment, a stacking structure includes a graphene layer, an intermediate layer formed on the graphene layer by using a linear type precursor, and a material layer formed on the intermediate layer by using an atomic layer deposition (ALD) method.

The intermediate layer may be formed of, or include, a material containing a metal.

The intermediate layer may be formed of, or include, a metal oxide.

The linear type precursor may be one of diethylzinc, (Be(N(SiMe$_3$)$_2$)$_2$, Co(N(SiEtMe$_2$)$_2$)$_2$, Fe(N(SiMe$_3$)$_2$)$_2$, Ge(NtBu$_2$)$_2$, Ge(NtBuSiMe$_3$)$_2$, Ni(N(SiMe$_3$)$_2$)$_2$, and Sn(NtBuSiMe$_3$)$_2$.

The intermediate layer may have a thickness in a range from about 0.1 nm to about 5 nm.

The material layer may be formed of a high-k (high dielectric constant) material.

The material layer may be formed of one of Al oxide, Ti oxide, Hf oxide, W oxide, Ta oxide, Ru oxide, Zr oxide, and Zn oxide.

According to another example embodiment, a method of forming a material layer on a graphene layer includes forming the graphene layer, forming an intermediate layer on a surface of the graphene layer by using a linear type precursor, and forming the material layer on the intermediate layer by using an ALD method.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
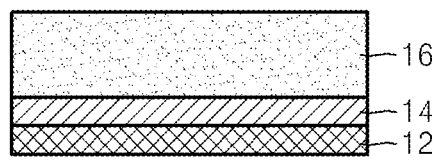
FIG. 1 is a cross-sectional view of a stacking structure having a material layer formed on a graphene layer according to an example embodiment.

Stacking structures having a material layer formed on a graphene layer, and methods of forming the material layer formed on the graphene layer will now be described in detail by accompanying drawings. In the drawings, the thicknesses of layers and regions are exaggerated for clarity. Also, like reference numerals in the drawings denote like elements. The example embodiments can be subjected to various modifications and may be embodied in many different forms.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a cross-sectional view of a stacking structure having a material layer 16 formed on a graphene layer 12 according to an example embodiment.

Referring to FIG. 1, an intermediate layer 14 may be formed on a surface of the graphene layer 12, and a predetermined, or alternatively desired, material layer 16 may be formed on the intermediate layer 14.

According to at least one example embodiments, graphene that constitutes the graphene layer 12 is formed by a small number of carbon atoms connected in a covalent bond and forms a polycyclic aromatic molecule. In this way, the carbon atoms, connected in a covalent bond, form a 6-atom ring as a basic repeating unit, but may further include a 5-atom ring or a 7-atom ring. The graphene layer 12 may be graphene having a single layer structure or a multilayer structure in which a plurality of single layers are stacked.

According to at least one example embodiments, a surface of the graphene layer 12 has a small adsorption area on which other materials are adsorbed, and thus, a material film is not easily formed on the surface of the graphene layer 12, in particular, when the material film is formed by using an atomic layer deposition (ALD) method. More specifically, a nucleation site is small on the surface of the graphene layer 12 since the surface has small defect sites, and thus, when the material layer 16 is formed on the surface of the graphene layer 12 by using the ALD method, the material layer 16 may be formed as an island type. In this case, the surface flatness of the material layer 16 may be low, and thus, physical uniformity of the material layer 16 may not be easily ensured.

Accordingly, in the current example embodiment, the material layer 16 having physical stability may be obtained by adding the intermediate layer 14 onto the surface of the graphene layer 12. The intermediate layer 14 is added in order to form the material layer 16 on the graphene layer 12, and thus, may act as a seed layer. The intermediate layer 14 may be formed by using a linear type precursor that may be used in an ALD method. Linear type precursors that may be used for forming the intermediate layer 14 include Diethylzinc, $(Be(N(SiMe_3)_2)_2$, $Co(N(SiEtMe_2)_2)_2$, $Fe(N(SiMe_3)_2)_2$, $Ge(NtBu_2)_2$, $Ge(NtBuSiMe_3)_2$, $Ni(N(SiMe_3)_2)_2$, and/or $Sn(NtBuSiMe_3)_2$. The intermediate layer 14 formed by using the linear type precursor may be a metal or a material that contains a metal. For example, the intermediate layer 14 may include at least one of Zn oxide, Ge oxide, Ni oxide, Fe oxide, Sn oxide, and Be oxide. Because the intermediate layer 14 is added in order to form the material layer 16 on the graphene layer 12, the intermediate layer 14 may not be required to have a large thickness. The intermediate layer 14 may have a thickness of less than a few nanometers (nm), for example, in a range of about 0.1 nm to about 5 nm, but the thickness of the intermediate layer 14 is not limited thereto.

The material layer 16 may be formed of a material to be formed on the graphene layer 12 by using an ALD method, and thus, the type of material is not specifically limited as long as the material layer may be formed by the ALD method. The material layer 16 may include a metal or an insulating material. The material layer 16 may be formed by including a dielectric material, and may include Si oxide or a high-k material having a dielectric constant higher than the dielectric constant of Si. For example, the material layer 16 may be formed of, or include, Al oxide, Ti oxide, Hf oxide, W oxide, Ta oxide, Ru oxide, Zr oxide, or Zn oxide. Also, when the material layer 16 is formed by using an ALD method, an effect on the layers thereunder, that is, the graphene layer 12 or a surface of the intermediate layer 14, may be smaller than when the material layer 16 is formed by using another deposition method such as, for example, a sputtering method. The material layer 16 formed by using the ALD method may have a relatively higher surface flatness or step coverage than the flatness or step coverage formed by using another deposition method. Since the material layer 16 is formed by an ALD method, the material layer 16 may be referred to as an ALD film.

Figure 2:
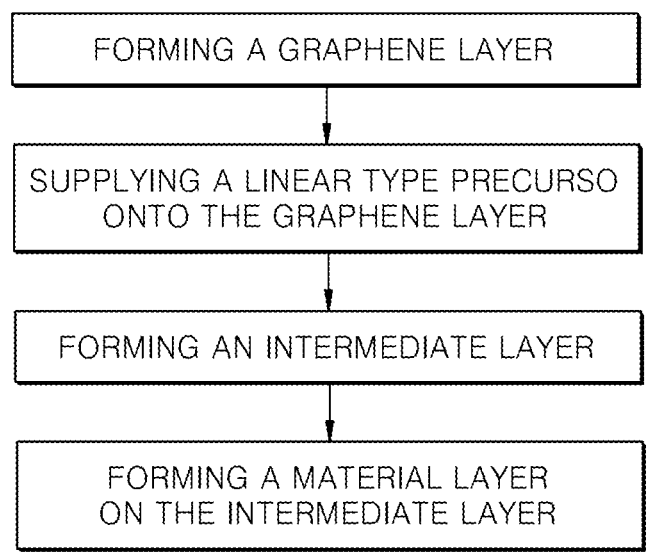
FIG. 2 is a flow chart illustrating a method of forming a material layer on a graphene layer according to an example embodiment.

FIG. 2 is a flow chart illustrating a method of forming the material layer 16 on the graphene layer 12 according to an example embodiment. FIGS. 3A through 3D are schematic perspective views illustrating a process of forming the material layer 16 on the graphene layer 12 according to an example embodiment.

Figure 3A:
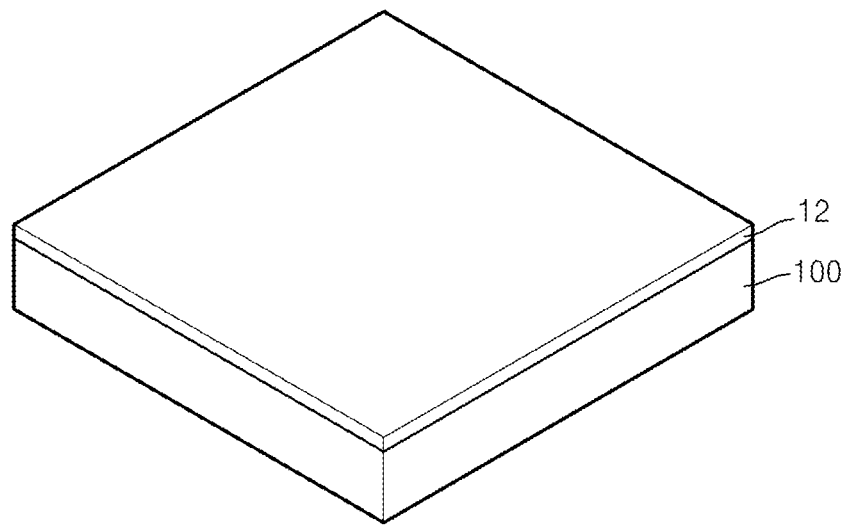
FIGS. 3A through 3D are schematic perspective views illustrating a process of forming a material layer on a graphene layer according to an example embodiment.

Referring to FIGS. 2 and 3A, the graphene layer 12 may be formed on a substrate 100. The graphene layer 12 may be formed by using a chemical vapor deposition (CVD) method. However, the example method is not limited thereto, that is, the graphene layer 12 may be formed by using a general method. The graphene layer 12 may be formed by directly forming graphene on the substrate 100, and may also be formed by transferring graphene already formed onto the substrate 100.

Figure 3B:
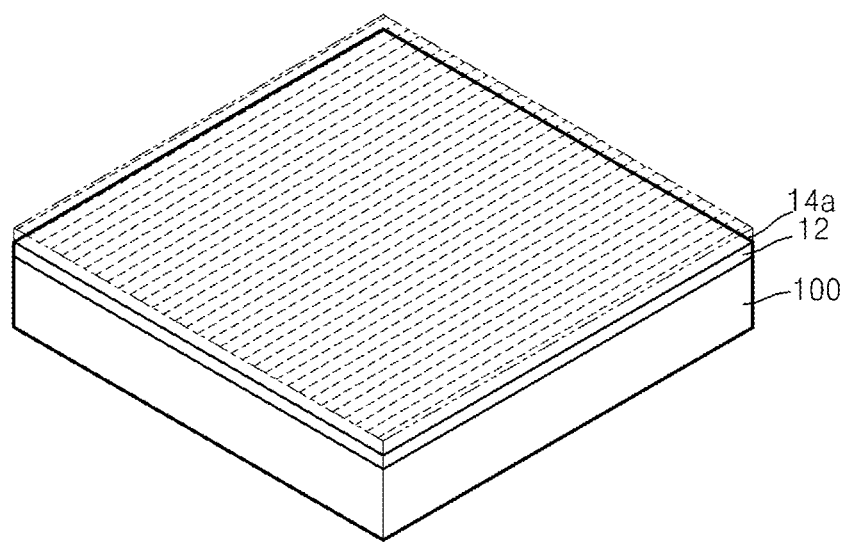

Referring to FIGS. 2 and 3B, a linear type precursor 14a may be supplied onto the graphene layer 12 to form the intermediate layer 14. The linear type precursor 14a, which includes a linear molecule, may be formed using an ALD method, and examples of the linear type precursor 14a may be diethylzinc, $(Be(N(SiMe_3)_2)_2$, $Co(N(SiEtMe_2)_2)_2$, $Fe(N(SiMe_3)_2)_2$, $Ge(NtBu_2)_2$, $Ge(NtBuSiMe_3)_2$, $Ni(N(SiMe_3)_2)_2$, or $Sn(NtBuSiMe_3)_2$.

Figure 4A:
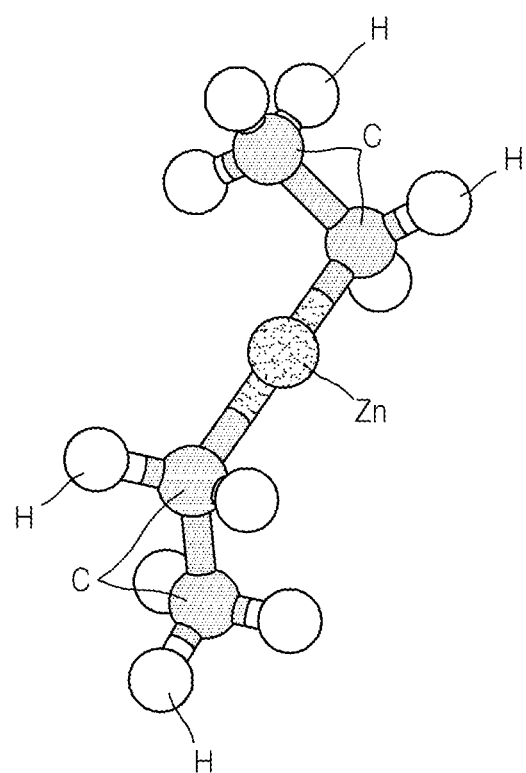
FIGS. 4A and 4B show a molecular structure of diethylzinc as an example of a linear type precursor.
Figure 4B:
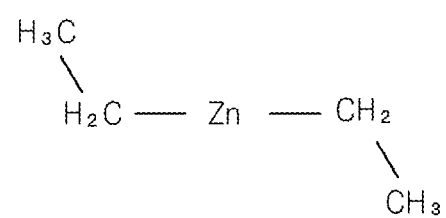

FIGS. 4A and 4B show a molecular structure of diethylzinc as an example of the linear type precursor 14a. Referring to FIGS. 4A and 4B, the diethylzinc as the linear type precursor 14a has a molecular structure in which hydrocarbons are formed on both sides of a Zn atom, that is, the carbon atoms and the Zn atom have a linear type connection structure of C—C—Zn—C—C. When the linear type precursor 14a having the structure described above is supplied on a surface of the graphene layer 12, the linear type precursor 14a may be positioned on the graphene layer 12 with a higher density than other structure precursors.

Figure 3C:
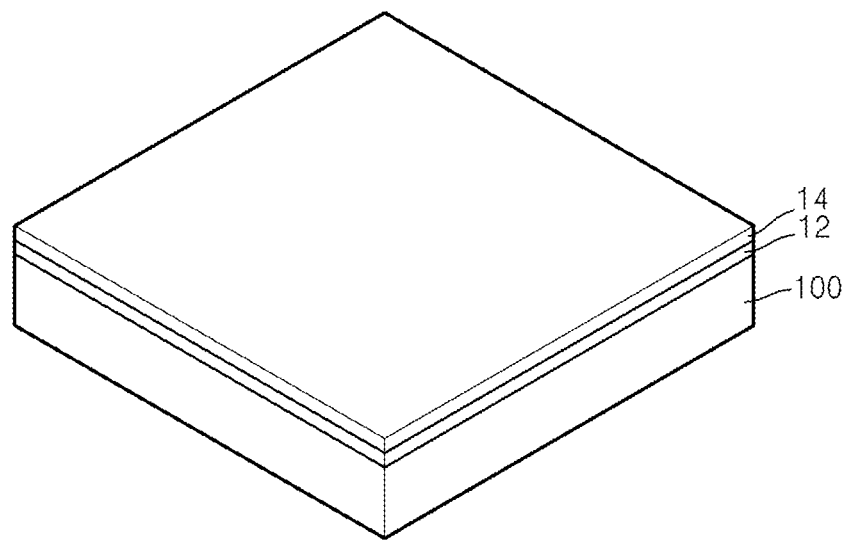

Referring to FIGS. 2 and 3C, the intermediate layer 14 may be formed by using the linear type precursor 14a on the surface of the graphene layer 12. The intermediate layer 14 may be used as a seed layer for forming the material layer 16 thereon. The intermediate layer 14 may be formed by an ALD method using the linear type precursor 14a. The intermediate layer 14 may be a metal or a material that includes a metal. For example, the intermediate layer 14 may include at least one of Zn oxide, Ge oxide, Ni oxide, Fe oxide, Sn oxide, and Be oxide. The intermediate layer 14 may have a thickness in a range from about 0.1 nm to about 20 nm, but the thickness of the intermediate layer 14 is not limited thereto.

Figure 3D:
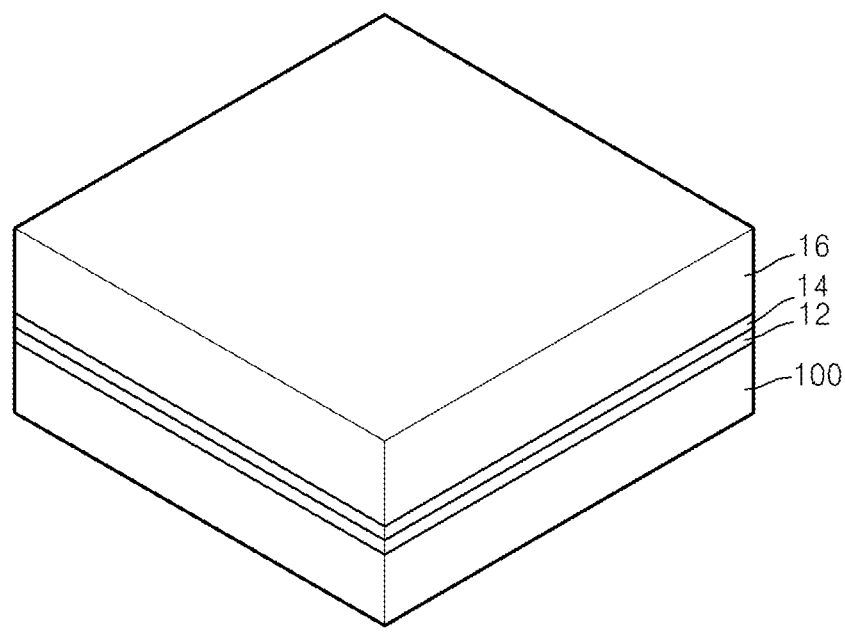

Referring to FIGS. 2 and 3D, the material layer 16 may be formed on the intermediate layer 14 by using an ALD method. The material layer 16 may be formed of a material to be formed by using an ALD method, and thus, the type of material is not specifically limited. The material layer 16 may include a metal or an insulating material. The material layer 16 may be formed by including a dielectric material, and may include Si oxide or a high-k material having a dielectric constant higher than the dielectric constant of Si. For example, the material layer 16 may be formed of Al oxide, Ti oxide, Hf oxide, W oxide, Ta oxide, Ru oxide, Zr oxide, or Zn oxide.

Figure 5:
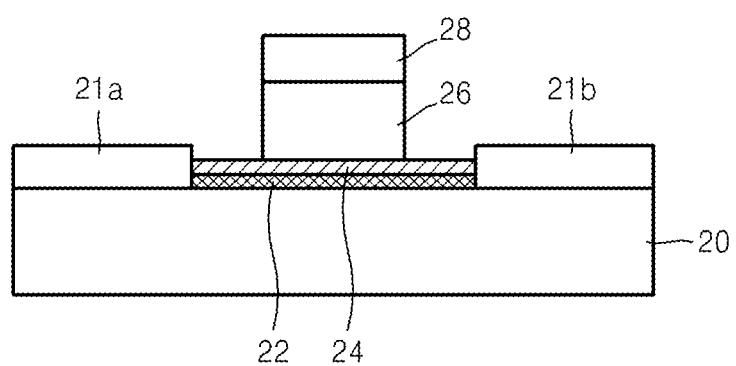
FIG. 5 is a cross-sectional view of an electronic device having a material layer formed on a graphene layer according to an example embodiment.

FIG. 5 is a cross-sectional view of an electronic device having the material layer 16 formed on the graphene layer 12 according to an example embodiment. More specifically, FIG. 5 shows a transistor device having a stacking structure that includes the material layer 16 formed on the graphene layer 12.

Referring to FIG. 5, a source electrode 21a and a drain electrode 21b that are separated from each other are formed on a substrate 20. A channel layer 22 is formed between the source electrode 21a and the drain electrode 21b. A gate insulating layer 26 and a gate electrode 28 may be formed on the channel layer 22.

The substrate 20 may be formed of, or include, a material used to form a substrate of an electronic device such as, for example, silicon. The source electrode 21a, the drain electrode 21b, and the gate electrode 28 may be formed of a conductive material, for example, a metal, a conductive metal oxide, a conductive metal nitride, or a carbon containing material such as, for example, carbon nanotube or graphene.

The channel layer 22 may be formed of, or include, graphene, and the gate insulating layer 26 may be formed on the channel layer 22 by using an ALD method. At this point, the gate insulating layer 26 may be formed of, or include, for example, Hf oxide. When the gate insulating layer 26 is formed by using Hf oxide on the channel layer 22 that is formed of graphene, after forming an intermediate layer 24 on a surface of the channel layer 22 in advance by using a linear type precursor, the gate insulating layer 26 may be formed on the intermediate layer 24. The gate electrode 28 may be formed on the gate insulating layer 26. FIG. 5 shows an electronic device having a structure that includes the intermediate layer 24 that is formed by using a linear type precursor on the surface of the channel layer 22, and the gate insulating layer 26 is formed on the channel layer 22 that is formed of, or that includes, graphene by using an ALD method. Here, at least one of the source electrode 21a, the drain electrode 21b, and the gate electrode 28 may be formed by including graphene. In this case, when an interlayer insulating layer is formed on the source electrode 21a, the drain electrode 21b, or the gate electrode 28 by using an ALD method, an intermediate layer may be formed by using a linear type precursor on a surface of the source electrode 21a, the drain electrode 21b, or the gate electrode 28.

In FIG. 5, a thin film transistor (TFT) formed of graphene is depicted as an example. However, the stacking structure that includes a material layer formed on a graphene layer according to an example embodiment may be applied to TFTs, and may also be applied to other electronic devices, regardless of the types thereof, when the material layer is formed on the graphene layer by using an ALD method.

According to an example embodiment, the density of adsorption areas on a surface of a graphene layer may be increased by using a linear type precursor. Since an intermediate layer is formed by increasing the density of the adsorption areas on the surface of the graphene layer, a dielectric layer may be readily formed on the graphene layer.

According to an example embodiment, since a structure that includes a dielectric layer on a graphene layer may be readily formed, applicability to various electronic devices may be increased.

It should be understood that the example embodiments described herein should be considered in a descriptive sense only and not for purposes of limitation. Descriptions of features or aspects within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope defined by the following claims.

What is claimed is:

1. An electronic device comprising;
    a source electrode;
    a drain electrode;
    a channel layer formed between the source electrode and the drain electrode, the channel layer including graphene;
    an intermediate layer formed on the channel layer, the intermediate layer being directly in contact with the channel layer;
    a gate insulating layer formed on the intermediate layer; and
    a gate electrode formed on the gate insulating layer;
    wherein the intermediate layer includes at least one of Ge oxide, Ni oxide, Fe oxide and Sn oxide;
    wherein the gate insulating layer comprises a material having a dielectric constant greater than a dielectric constant of Si, or one of Al oxide, Ti oxide, Hf oxide, W oxide, Ta oxide, Ru oxide, Zr oxide, and Zn oxide,
    wherein the intermediate layer act as a seed layer making the gate insulating layer have physical stability, and
    wherein the intermediate layer is formed on the channel layer from a linear type precursor, the linear type precursor comprises at least one of diethylzinc, $(Be(N(SiMe_3)_2)_2$, $Co(N(SiEtMe_2)_2)_2$, $Fe(N(SiMe_3)_2)_2$, $Ge(NtBu_2)_2$, $Ge(NtBuSiMe_3)_2$, $Ni(N(SiMe_3)_2)_2$, and $Sn(NtBuSiMe_3)_2$.

2. The electronic device of claim 1, wherein the intermediate layer has a thickness in a range of about 0.1 nm to about 5 nm.

3. A method of forming an electronic device, the method comprising:
    forming a source electrode, a drain electrode, a channel layer formed between the source electrode and the drain electrode, the channel layer including graphene;
    forming an intermediate layer that is a board-shaped thin layer lying on a surface of the channel layer by using a linear type precursor, the intermediate layer including at least one of Ge oxide, Ni oxide, Fe oxide and Sn oxide and being directly in contact with the channel layer;
    forming a gate insulating layer on the intermediate layer by using an ALD method, the gate insulating layer comprising a material having a dielectric constant greater than a dielectric constant of Si, or at least one of Al oxide, Ti oxide, Hf oxide, W oxide, Ta oxide, Ru oxide, Zr oxide, and Zn oxide wherein the intermediate layer act as a seed layer making the gate insulating layer have physical stability, and
    wherein the linear type precursor comprises at least one of diethylzinc, $(Be(N(SiMe_3)_2)_2$, $Co(N(SiEtMe_2)_2)_2$, $Fe(N(SiMe_3)_2)_2$, $Ge(NtBu_2)_2$, $Ge(NtBuSiMe_3)_2$, $Ni(N(SiMe_3)_2)_2$, and $Sn(NtBuSiMe_3)_2$.

4. The method of claim 3, wherein the intermediate layer has a thickness in a range of about 0.1 nm to about 5 nm.

* * * * *